United States Patent

Matsuo et al.

[11] Patent Number: 5,982,623
[45] Date of Patent: *Nov. 9, 1999

[54] MODULE FOR PACKAGED IC

[75] Inventors: Takahiro Matsuo, Hirakata; Yoshio Maruyama, Kyoto; Osamu Hikita, Neyagawa; Shinji Kadoriku, Takarazuka, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/590,465

[22] Filed: Jan. 23, 1996

[30] Foreign Application Priority Data

Jan. 23, 1995 [JP] Japan ..................... 7-008546

[51] Int. Cl.⁶ ..................................... H05K 7/20
[52] U.S. Cl. .................. 361/719; 165/185; 174/52.2; 361/773
[58] Field of Search ..................................... 428/209, 901; 165/80.3, 185; 174/252, 260, 16.3, 52.2; 257/706, 707, 713, 675; 361/717–719, 760, 773, 690, 704, 705, 707–715

[56] References Cited

U.S. PATENT DOCUMENTS

| | | | |
|---|---|---|---|
| 4,326,238 | 4/1982 | Takeda | 361/386 |
| 4,529,755 | 7/1985 | Nishikawa | 523/436 |
| 4,769,344 | 9/1988 | Sakai | 437/216 |
| 4,933,744 | 6/1990 | Segawa | 357/72 |
| 4,965,699 | 10/1990 | Jorden | 361/387 |
| 4,974,119 | 11/1990 | Martin | 361/386 |
| 5,043,211 | 8/1991 | Yoshizumi | 428/331 |
| 5,313,365 | 5/1994 | Pennisi | 361/760 |
| 5,371,404 | 12/1994 | Jusjey | 257/659 |
| 5,399,416 | 3/1995 | Butard | 428/209 |
| 5,469,333 | 11/1995 | Ellerson | 361/760 |
| 5,572,070 | 11/1996 | Ross | 257/713 |

*Primary Examiner*—Gerald Tolin
*Attorney, Agent, or Firm*—Wenderoth, Lind & Ponack, L.L.P.

[57] ABSTRACT

A module is provided for a packaged IC designed to radiate heat by sealing the packaged IC. At least outer lead parts the packaged IC which are mounted on an electronic circuit board are sealed by a sealing material of a high thermal conductivity to form a sealing part.

4 Claims, 1 Drawing Sheet

MODULE FOR PACKAGED IC

BACKGROUND OF THE INVENTION

The present invention relates to a module for efficiently reducing heat generated from a packaged IC mounted on an electronic circuit board during operation.

As shown in FIG. 2, conventionally a metallic heat sink 7 or a cooling fin 8 is fixed to a packaged IC by an adhesive or the like so as to radiate heat generated from the packaged IC mounted on an electronic circuit board during operation. Alternatively, the packaged IC is mounted on a metallic substrate 9.

When the heat sink 7 or cooling fin 8 is set at a package part 1 as in the prior art, the total height of the packaged IC is disadvantageously increased. Moreover, the volume for mounting of the package part should be increased to prevent electric shortcircuits between the heat sink 7 or cooling fin 8 made of metal and the packaged IC, which fact eventually hinders the electronic device from being compact. Since a layering of metallic substrates, if metallic substrates are used, has limitations, and the area of each substrate cannot be reduced, a heat generating part should be formed of a separate substrate (that is, formed of a different module), thus raising the cost of the product.

SUMMARY OF THE INVENTION

The object of the present invention is therefore to provide a module for a packaged IC which can prevent an temperature rise of a heat generating body such as an packaged IC, etc.

In accomplishing the above and other objects, according to a first aspect of the present invention, there is provided a module for a packaged IC designed to radiate heat by sealing a packaged IC, including outer lead parts, which is mounted on an electronic circuit board by means of a sealing material of a high thermal conductivity to form a sealing part.

According to a second aspect of the present invention, there is provided a module for a packaged IC according to the first aspect, wherein the sealing part seals the whole of the packaged IC, including the outer lead parts.

According to a third aspect of the present invention, there is provided a module for a packaged IC according to the first aspect, wherein the sealing part seals only outer lead parts of the packaged IC.

According to a fourth aspect of the present invention, there is provided a module for a packaged IC according to the first aspect, wherein the sealing part partly has a cooling fin.

According to a fifth aspect of the present invention, there is provided a module for a packaged IC according to the first aspect, wherein the sealing material is composed of a filler of high thermal conductivity and either a thermosetting resin material or a thermoplastic resin material. The filler is one material selected from the group consisting of one or more kinds of metallic powders, metallic fibers, powders or whiskers of oxide, powders of nitride, powders or whiskers of carbon or graphite, and powders of diamond.

According to a sixth aspect of the present invention, there is provided a module for a packaged IC according to the fifth aspect, wherein in the filler, the metallic powders comprise aluminum powders and copper powders;

the powders or whiskers of oxide comprise alumina, zinc oxide, and magnesium oxide; and the powders of nitride comprise boron nitride, and aluminium nitride.

According to a seventh aspect of the present invention, there is provided a module for a packaged IC according to the sixth aspect, wherein the thermosetting resin material is a multifunctional epoxy resin selected from the group consisting of o-cresol novolak epoxy resin and biphenyl epoxy resin.

According to an eighth aspect of the present invention, there is provided a module for a packaged IC according to the sixth aspect, wherein the thermoplastic resin is crystalline polymer selected from the group consisting of liquid crystal polymer resistive to reflow-soldering, polyphenylene sulfide, and syndiotactic polystyrene resin.

According to a ninth aspect of the present invention, there is provided a module for a packaged IC according to the first aspect, wherein the sealing material is black and superior not only in conduction of heat, but also in radiation of heat.

BRIEF DESCRIPTION OF THE DRAWINGS

These and other objects and features of the present invention will become clear from the following description taken in conjunction with the preferred embodiments thereof and with reference to the accompanying drawings, and in which.

DETAILED DESCRIPTION OF THE PREFERRED EMBODIMENTS

Figure 1A:
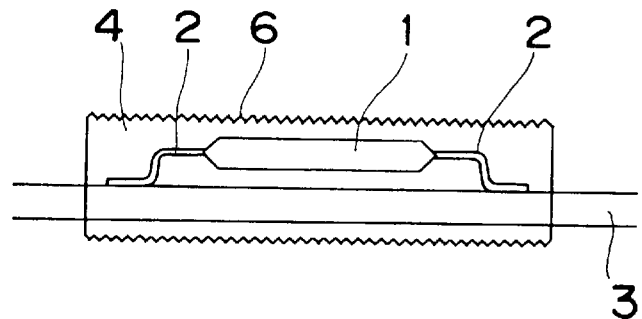
FIGS. 1A and 1B are sectional views of modules for packaged ICs according to preferred embodiments of the present invention.

Before the description of the present invention proceeds, it is to be noted that like parts are designated by like reference numerals throughout the accompanying drawings.

Preferred embodiments of the present invention will be described with reference to the drawings.

FIG. 1A is a sectional view of a part of an electronic circuit module, more specifically, a packaged IC of the electronic circuit module sealed by a sealing resin of a high thermal conductivity according to a first preferred embodiment of the present invention. A packaged part 1 which generates heat when operating has outer lead parts 2 at both ends thereof, and is mounted on an electronic circuit board 3 and sealed by a sealing part 4 of a sealing resin of a high thermal conductivity as is shown in the drawing. The heat generated at a part of the packaged IC is scattered in the whole of the sealing part 4 to uniformly cool the packaged IC. Cooling fins 6 provided at an upper surface of the sealing part 4 further improve the cooling efficiency.

The sealing resin of high thermal conductivity used in the embodiment is a 70 wt % blend of magnesium oxide of high thermal conductivity with a liquid crystal polymer (LCP), which is a thermoplastic resin.

According to the embodiment, the temperature of the packaged IC before being sealed by the sealing resin of the high thermal conductivity is 100° C. during operation. The temperature is decreased to 85° C. after being sealed by the resin. In other words, the radiation effect is greatly improved.

Figure 1B:
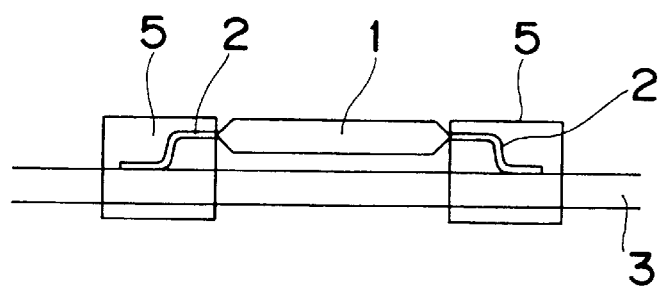
Figure 2:
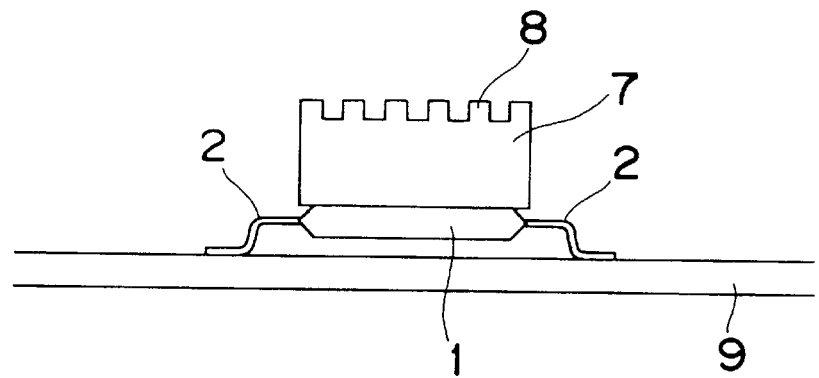
FIG. 2 is a schematic diagram of a cooling fin according to a radiation method in the prior art.

FIG. 1B is a sectional view of a part of a packaged IC of an electronic circuit module sealed by a sealing resin of a high thermal conductivity according to a second embodiment of the present invention. Since the outer lead parts 2 having the highest thermal conductivity of the packaged IC 1 and mounted on the electronic circuit board 3, are sealed at sealing parts 5 by a sealing resin of high thermal conductivity, the heat of the packaged IC 1 is removed through conduction of the heat via the outer lead parts 2 and the sealing resin. This prevents the temperature rise of the packaged part 1 wherein a semiconductor device is sealed.

Moreover, the sealing resin is blackened to radiate the heat in the air, and so the avoidance of a temperature rise of the packaged part 1 is more effective. As a consequence of this, although the packaged part 1 before being sealed is 100° C. during the operation, temperature is lowered to 87° C. after the outer lead parts 2 of the packaged part 1 are sealed. In the absence of sealing at the packaged part 1 itself, the mounting height of the module is restricted to not be large.

The sealing resin of the high thermal conductivity used in the second embodiment is obtained by blending alumina of a high thermal conductivity at 65 wt % with polyphenylene sulfide (PPS), which is a thermoplastic resin, and also blending whiskers of highly conductive graphite of 5 wt % as a black coloring agent.

A thermosetting epoxy resin (multifunctional epoxy resin such as o-cresol novolak epoxy resin or biphenyl epoxy resin, etc.) may be used in place of the thermoplastic sealing resin, whereby a similar effect is achieved. Thus, the epoxy resin may be used as well.

According to the embodiments of the present invention, the whole of the packaged IC 1, including the outer lead parts 2 of the packaged IC 1, which has most superior heat radiation properties, or the outer lead parts 2 by themselves are sealed by the sealing material of the high thermal conductivity, so that the heat is radiated not only from the package part 1, but also from the outer lead parts 2, thereby preventing a temperature rise of the packaged IC 1, etc. When the sealing material of the high thermal conductivity is made black, the heat radiation efficiency can be improved and the heat radiation properties can be enhanced. If necessary, the sealing material can be partly made rough to facilitate the action of the cooling fins 6 to thereby improve the cooling efficiency. The sealing material may be formed at a front surface or both surfaces of the electronic circuit board 3.

In the embodiments, the sealing part 4 the sealing material of the high thermal conductivity can seal the whole of the packaged IC 1. Alternatively, however the sealing part 5 may seal only the outer lead parts 2 of the packaged IC 1.

In the embodiments, the sealing material of high thermal conductivity of the sealing parts 4, 5 is composed of a filler of a high thermal conductivity and a thermosetting or a thermoplastic resin material. Alternatively, the sealing material of high thermal conductivity can be black and can be superior not only in the conduction of heat, but also in the radiation of heat.

For the filler of high thermal conductivity, one or more kinds of metallic powders such as aluminum powders or copper powders, metallic fibers, powders or whiskers of oxide such as alumina, zinc oxide, magnesium oxide, etc., powders of nitride such as boron nitride, aluminium nitride, etc., powders or whiskers of carbon or graphite, powders of diamond, etc. may be selected.

For the thermosetting resin material, a multifunctional epoxy resin such as o-cresol novolak epoxy resin, biphenyl epoxy resin, etc. that is generally used for sealing of semiconductors is utilizable. The thermoplastic resin used is a crystalline polymer such as a liquid crystal polymer (LCP) resistive to reflow-soldering, polyphenylene sulfide (PPS), or syndiotactic polystyrene resin (SPS), etc.

According to the present invention, in order to radiate heat generated by the packaged IC mounted on the circuit board during operation, the whole of the packaged IC, including the outer lead parts having the highest radiation properties, or the outer lead parts by themselves are sealed by the sealing material of good thermal conductivity. The heat generated at a part of the packaged IC is thus uniformly scattered in the whole of the sealing part to thereby lower the temperature. Owing to an increased radiation area, the temperature can be effectively lowered. That is, the cooling efficiency can be improved and the temperature rise of the packaged IC can be prevented. A metallic substrate, a heat sink, a cooling fin, a cooling fan or similar cooling members necessitated in the prior art, can be eliminated. The number of components can thus be decreased, costs can be reduced, the volume occupied by the mounted packaged IC can be reduced, the packaged IC becomes thin, and consequently the electronic device as a whole can be made more compact in size.

When the cooling fin is provided at a part of the sealing part, it can enhance the cooling efficiency. When the sealing member of high thermal conductivity is blackened, the heat radiation efficiency can be furthermore improved, thus more efficiently lowering the temperature of the packaged IC.

The present invention is applicable to components and modules requiring heat radiation and also mechanism components or structural components, e.g., housings, casings and the like.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A module for a packaged IC, comprising:

a packaged IC including a packaged part and outer lead parts extending from said packaged part to, and being mounted on, an electronic circuit board; and a sealing part comprising a sealing material having a high thermal conductivity sealing only said outer lead parts of said packaged IC between said packaged part and said electronic circuit board for conducting and radiating heat from said outer lead parts;

wherein the sealing material comprises:

a material selected from the group consisting of a thermosetting resin material and a thermoplastic resin material; and a filler material having a high thermal conductivity selected from the group consisting of metallic powders, a plurality of kinds of metallic powders, metallic fibers, powders of oxide, whiskers of oxide, powders of nitride, powders of carbon, powders of graphite, whiskers of carbon, whiskers of graphite, and powders of diamond.

2. The module of claim 1, wherein:

said metallic powders are selected from the group consisting of aluminum powders and copper powders;

said powders of oxide and said whiskers of oxide are each selected from the group consisting of alumina, zinc oxide, and magnesium oxide; and said powders of nitride are selected from the group consisting of boron nitride and aluminum nitride.

3. The module of claim 1, wherein said sealing material is black.

4. The module of claim 1, wherein said sealing part covers the whole of said outer lead parts and leaves the remainder of said packaged IC uncovered by said sealing material.

* * * * *